United States Patent
Yang et al.

(10) Patent No.: US 11,715,770 B2
(45) Date of Patent: Aug. 1, 2023

(54) FORMING SEMICONDUCTOR STRUCTURES WITH SEMIMETAL FEATURES

(71) Applicants: Taiwan Semiconductor Manufacturing Co., Ltd., Hsinchu (TW); National Taiwan University, Taipei (TW)

(72) Inventors: Che-Wei Yang, New Taipei (TW); Hao-Hsiung Lin, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/682,897

(22) Filed: Nov. 13, 2019

(65) Prior Publication Data

US 2020/0083333 A1 Mar. 12, 2020

Related U.S. Application Data (62) Division of application No. 15/922,730, filed on Mar. 15, 2018, now Pat. No. 10,504,999.

(51) Int. Cl.
*H01L 29/24* (2006.01)
*H01L 21/8238* (2006.01)
*H01L 29/10* (2006.01)
*H01L 27/092* (2006.01)

(52) U.S. Cl.
CPC ...... *H01L 29/24* (2013.01); *H01L 21/823807* (2013.01); *H01L 21/823814* (2013.01); *H01L 21/823871* (2013.01); *H01L 27/092* (2013.01); *H01L 29/1033* (2013.01)

(58) Field of Classification Search
CPC ..... H01L 29/24; H01L 29/12; H01L 29/1054; H01L 29/1033; H01L 21/823807; H01L 21/823814; H01L 21/8238–823892; H01L 29/20; H01L 29/201–207; H01L 29/41783
See application file for complete search history.

(56) References Cited

U.S. PATENT DOCUMENTS

| | | | |
|---|---|---|---|
| 11,508,731 B1* | 11/2022 | Guo | H10B 12/488 |
| 2005/0019203 A1* | 1/2005 | Saitoh | H01L 27/124 |
| | | | 420/506 |
| 2010/0316874 A1 | 12/2010 | Kim et al. | |

(Continued)

OTHER PUBLICATIONS

Gity et al., "Reinventing solid state electronics: Harnessing quantum confinement in bismuth thin films," *Applied Physics Letters* 110:093111, 2017. (5 pages).

*Primary Examiner* — Didarul A Mazumder
*Assistant Examiner* — Gustavo G Ramallo
(74) *Attorney, Agent, or Firm* — Seed IP Law Group (57) ABSTRACT

The current disclosure describes semiconductor devices, e.g., transistors including a thin semimetal layer as a channel region over a substrate, which includes bandgap opening and exhibits semiconductor properties. Described semiconductor devices include source/drain regions that include a thicker semimetal layer over the thin semimetal layer serving as the channel region, this thicker semimetal layer exhibiting metal properties. The semimetal used for the source/drain regions include a same or similar semimetal material as the semimetal of the channel region.

20 Claims, 8 Drawing Sheets

(56) References Cited

U.S. PATENT DOCUMENTS

| | | | | |
|---|---|---|---|---|
| 2013/0052779 | A1* | 2/2013 | Flachowsky | H01L 21/823814 |
| | | | | 438/229 |
| 2016/0268382 | A1* | 9/2016 | Colinge | H01L 21/76224 |
| 2017/0271499 | A1* | 9/2017 | Lee | H01L 23/3731 |
| 2017/0358658 | A1* | 12/2017 | Rios | H01L 29/78636 |
| 2019/0043963 | A1* | 2/2019 | Baars | H01L 29/78654 |
| 2021/0005722 | A1* | 1/2021 | Glass | H01L 29/0653 |

* cited by examiner

FORMING SEMICONDUCTOR STRUCTURES WITH SEMIMETAL FEATURES

TECHNICAL FIELD

This disclosure relates generally to fabricating semiconductor structures, and in some embodiments, to a process for forming a semiconductor transistor including semimetal features.

BACKGROUND

Complementary metal oxide semiconductor (CMOS) transistors are building blocks for integrated circuits. A CMOS transistor generally comprises a semiconductor substrate, a channel layer above or within the semiconductor substrate, a gate oxide layer and a gate stack above the channel layer, and source and drain diffusion regions in the surface of the semiconductor substrate. Electrical contacts are made to the gate stack, and to the source and drain diffusion regions of the CMOS transistor. With the advent of high-K dielectric materials as a gate insulating layer in the CMOS process, metal gates may be used in the CMOS devices.

Low-resistance contacts to semiconductor materials are important for the performance and reliability of semiconductor devices. As CMOS transistor dimensions scale down, semiconductor materials, e.g., InGaAs, are used to replace traditional silicon substrates. As such, providing low resistance contacts at metal-semiconductor junctions, e.g., between, among other things, a metal contact and the semiconductor materials of and/or about a source/drain region is an important objective in the design and manufacture of metal-semiconductor structures.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Techniques in accordance with embodiments described herein take advantage of properties of semimetal materials to deliver process to obtain semiconductor structures with homogenous contacts, for example, the contact and the source/drain regions of a transistor includes a same semimetal material and/or the source/drain regions and the channel layer of a transistor include a same semimetal material.

Various embodiments described herein are based on the observation that a semimetal material feature exhibits metal properties, e.g., electrical conductivity properties similar to a metal, when deployed in a large scale, and exhibits semiconductor properties, e.g., including a bandgap opening, when deployed in a small scale. An example semiconductor structure in accordance with some embodiments described herein includes a thin layer of a semimetal material, e.g., bismuth (Bi), as a channel layer, and a thicker semimetal-containing region, e.g., of the same Bi material, as a source/drain region. The thin semimetal channel layer exhibits semiconductor properties. The thicker semimetal source/drain region exhibits metal properties, e.g., electrical conductivity. The semiconductor structure, e.g., a transistor also includes a high-k metal gate over the channel layer. The high-K metal gate includes a high-K dielectric layer over the channel layer and a gate electrode over the high-K dielectric layer. The gate electrode may be made of the same semimetal materials as the source/drain region through a same formation layer as the source/drain region or may be formed as a separate layer using a different conductive material, e.g., metal or metal compounds.

Techniques described herein also include an example method of making a semiconductor structure, e.g., a transistor with electrical contacts between different regions, e.g., channel layer and source/drain region that are homogenous on the materials thereof, e.g., having a same semimetal material. For example, in an example embodiment, a thin semimetal layer, namely "first semimetal layer", is formed over a substrate. This first semimetal layer is thinner than a first threshold, e.g., smaller than 10 nm for Bi, such that the first semimetal layer exhibits semiconductor properties, e.g., the conductivity is controllable through application of an electrical field or "gating". A high-K dielectric layer is formed over the first semimetal layer and is patterned to form a raised dielectric region. A second semimetal layer is formed over the first semimetal layer. The second semimetal layer is patterned to form a source/drain region adjacent to the raised dielectric region. The source/drain region has a thickness (or height) larger than a second threshold, e.g., equal to or larger than 10 nm for Bi, such that the semimetal source/drain region exhibits a metal property, namely, the electronic properties of a metal material relevant/useful for semiconductor devices/structures, e.g., always non-zero conductivity. In an example, when the second semimetal layer and the first semimetal layer include the same semimetal material and the combination of the second semimetal layer and the first semimetal layer below the source/drain region exhibit a thickness larger than the second threshold, the combination of the second semimetal layer and the first semimetal layer below the source/drain region exhibits a metal property, e.g. electrical conductivity. As such, in an example, the thickness of the second semimetal layer is not larger than the second threshold, e.g., 10 nm for Bi, and the combination of the first semimetal layer and the second semimetal layer, namely the source/drain region, has a thickness larger than the second threshold, e.g., 10 nm for Bi.

As the source/drain region itself exhibits metal properties and the source/drain region and the channel layer include a same semimetal material, e.g., Bi, the contact resistance at the metal (e.g., source/drain region)-semiconductor (e.g., channel layer) junction is effectively managed to be acceptably low. Further, embodiments of the fabrication processes for such acceptable junctions described herein are simple and cost effective.

In some embodiments, the gate electrode may also be made by patterning the second semimetal layer. That is, in some embodiments, the second semimetal layer may be formed over the raised dielectric region and may include a thickness higher than the second threshold, e.g., 10 nm for Bi. In these embodiments, after patterning the second semimetal, a first portion of the second semimetal layer remains over the raised dielectric region and is separated by the dielectric region from the thin Bi channel layer. The first portion is configured as a gate electrode. A second separate portion of the second semimetal layer, i.e., separated from the first portion, is configured as the source/drain region.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description references a transistor as an example of a semiconductor structure to which the present description applies; however, the present description is not limited in applicability to transistors. For example, the follow description applies to other types of semiconductor structures that are not transistors where the provision of low resistance electrical contact at junctions between features exhibiting semiconductor properties and features exhibiting electrical conductive properties, e.g. metal properties are desirable.

Figure 9:
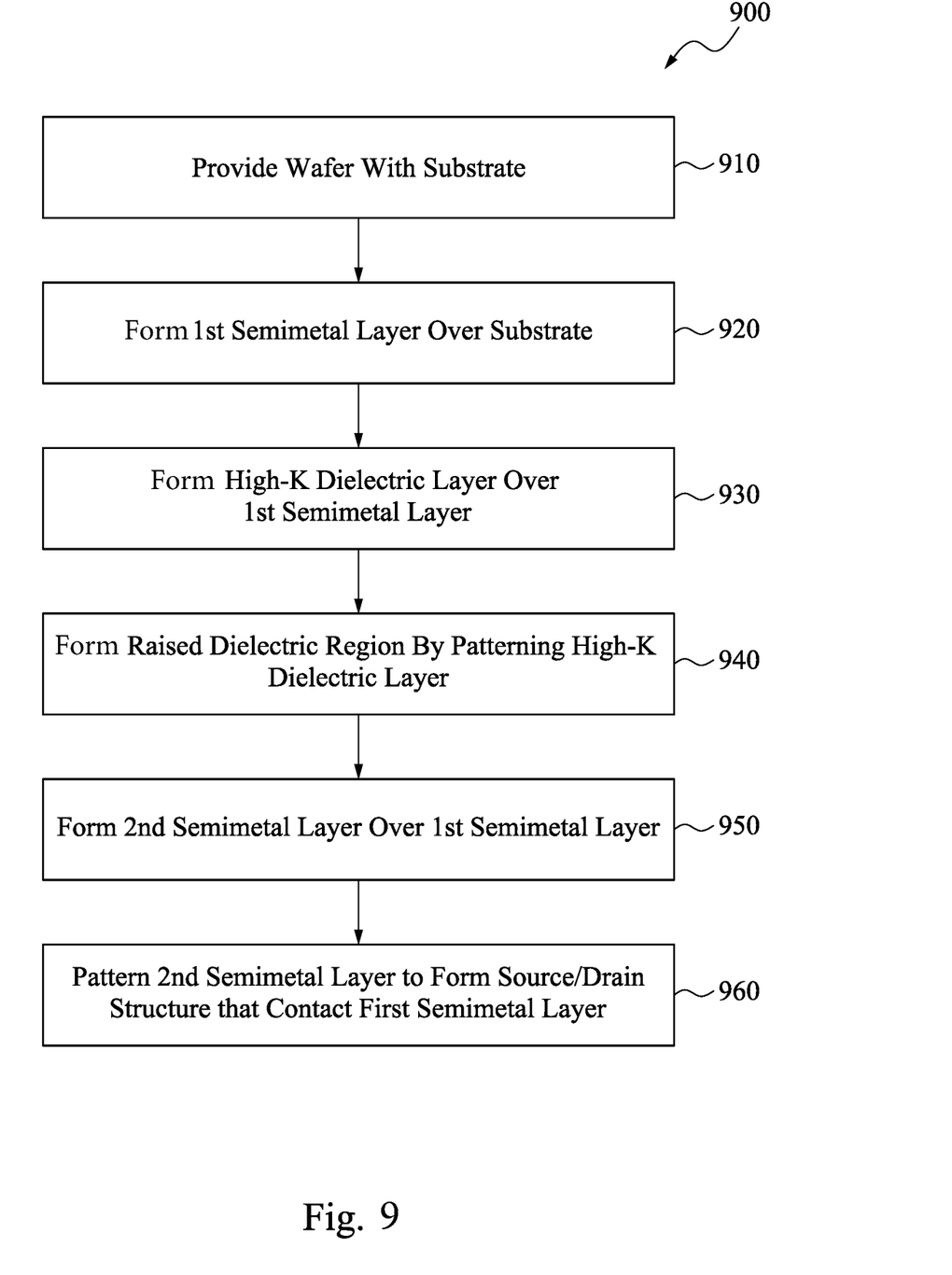
FIG. 9 illustrates an example sequence of fabrication steps according to embodiments of the disclosure.

FIG. 9 illustrates an example fabrication process 900 of making a transistor including a channel layer of a semimetal material and a source/drain region of a semimetal material. Referring to FIG. 9, with reference also to FIG. 1, in example operation 910, a wafer 100 is provided. Wafer 100 includes a substrate 120. Substrate 120 includes a silicon substrate in crystalline structure and/or other elementary semiconductors like germanium. Alternatively or additionally, substrate 120 includes a compound semiconductor such as silicon carbide, gallium arsenide, indium arsenide, indium gallium arsenide (InGaAs) and/or indium phosphide. Further, substrate 120 also includes a silicon-on-insulator (SOI) structure. Substrate 120 may also be other suitable substrates, which are all included in the disclosure and non-limiting. Substrate 120 may include an epitaxial layer and/or may be strained for performance enhancement. Substrate 120 may also include various doping configurations depending on design requirements as such as p-type substrate and/or n-type substrate and various doped regions such as p-wells and/or n-wells.

Figure 1:
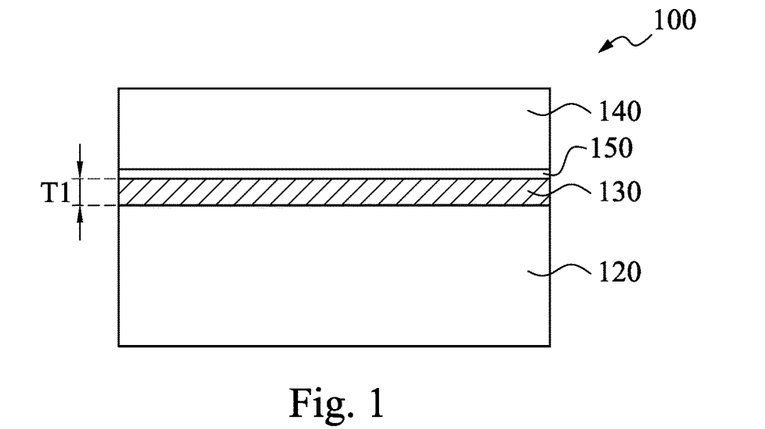
FIGS. 1-4 illustrate cross-sectional views of an example semiconductor structure at various stages of fabrication according to embodiments of the disclosure.

In example operation 920, a first semimetal layer 130 of a first thickness $T_1$ is formed over substrate 120. First semimetal layer 130 is formed of a suitable semimetal material including, but not limited to, bismuth (Bi), gray tin (α-Sn), graphite, arsenic (As) and antimony (Sb) and other suitable semimetals. Other suitable semimetal material (or materials having semimetal properties) may include two dimension (monolayer) materials like arsenene, antimonene, phosphorene, graphene, stanine, or germanene. In an example, first semimetal layer 130 is a bismuth (Bi) layer. The deposition of first semimetal layer 130 may be achieved using various suitable approaches including, but not limited to, thermal deposition processes like chemical vapor deposition (CVD), atomic layer deposition (ALD) and remote oxygen scavenging, molecular beam deposition, plasma processes like physical vapor deposition (PVD) and ionized PVD, plating, or other suitable process.

In an example, first thickness $T_1$ of first semimetal layer 130 is smaller than a first threshold below which first semimetal layer 130 exhibits semiconductor properties. In the example of bismuth (Bi), $T_1$ is smaller than 10 nm. That is, first Bi layer 130 is thinner than 10 nm and exhibits semiconductor properties. Depending on the semimetal materials used in first semimetal layer 130, the first threshold may be further determined based on the potential environment temperatures, as the electronic state of a semimetal material may vary with the environmental temperature. For example, in same example, first thickness $T_1$ of first semimetal layer 130 is smaller than 2 nm to exhibit a semiconductor property at room temperature, namely about 20° C. In addition, depending on the semimetal used, the first threshold maybe more than 10 nm or may be less than 10 nm. In an embodiment, first thickness $T_1$ is within a first range between about 1.5 nm to about 9.5 nm.

Alternatively or additionally, various processes may be conducted on first semimetal layer 130 to introduce, enlarge, and/or tune the semiconductor properties of the semimetal layer 130. For example, patterning, straining, and/or surface doping may be applied to first semimetal layer 130 to cause first semimetal layer 130 to exhibit semiconductor properties and act like a semiconductor material.

As referred to herein, a semiconductor property of a material or a state of a material indicates that for the material or the state of the material, the Fermi level ($E_F$) lies inside a gap between a filled valence band and an empty conduction band, namely a "bandgap", and the bandgap is larger than zero and smaller than 4 electron-volt (eV). As a semimetal material in normal state does not include a bandgap, the term "bandgap opening" is used herein to refer to a state of the semimetal material where a bandgap exists in the electronic state of the semimetal material such that the semimetal material exhibits a semiconductor property. As described herein, the bandgap opening of first semimetal layer 130 of a semimetal material may be achieved through one or more of a thickness $T_1$ of first semimetal layer 130 is smaller than a first threshold, patterning, straining, and/or surface doping, and other suitable approaches.

In example operation 930, a high-k (high dielectric constant) dielectric layer 140 is formed over first semimetal layer 130. In example embodiments, high-k dielectric material is selected from one or more of hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfArO), combinations thereof, and/or other suitable materials. A high-K dielectric material includes a dielectric constant value larger than that of thermal silicon oxide (~3.9), and in some applications, may include a dielectric constant (K) value larger than 6. Depending on design requirements, a dielectric material of a dielectric constant (K) value of 7 or higher may be used.

High-K dielectric layer 140 may be formed by atomic layer deposition (ALD) or other suitable technique. In an example, high-K dielectric layer 140 includes a thickness ranging from about 10 to about 30 angstrom (Å) or other suitable thickness depending on design and process requirements/variations.

In example embodiments, optionally, an interfacial layer 150 of thermal or chemical oxide, e.g., $BiO_x$, $BiN_y$, having a thickness ranging from about 5 to about 10 angstrom (Å), no more than 10 angstrom (Å), may be formed between first semimetal layer 130 and high-K dielectric layer 140 using any suitable processes.

Figure 2:
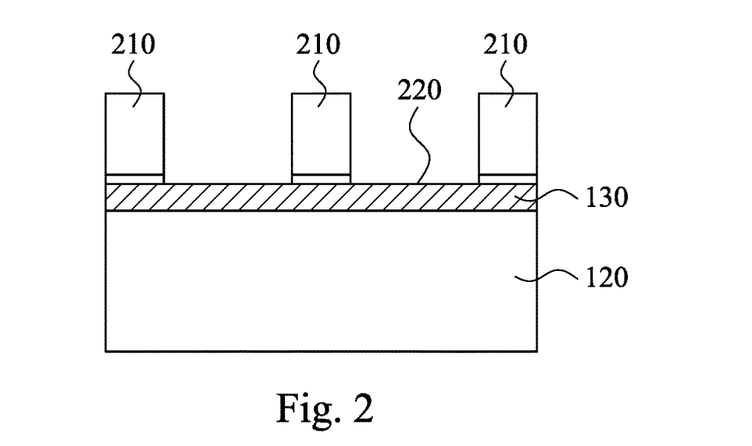

In example operation 940, with reference also to FIG. 2, high-K dielectric layer 140 is patterned to form raised dielectric regions 210. The formation of raised dielectric region 210 may use any suitable patterning approaches and all are included in the disclosure. For example, a lithograph and etching process may be performed to pattern high-K dielectric layer 140 to form raised dielectric regions 210.

For example, a mask layer of a photoresist material may be formed and patterned overlaying high-K dielectric layer 140 such that portions of high-K dielectric layer 140 are masked, which overlap the to-be-made raised dielectric regions 210. Then the unmasked portions of high-K dielectric layer 140 (and the relevant interfacial layer 150, if any) may be removed by etching. Suitable etching techniques include general etching techniques or selective etching techniques. In an example, the general etching technique may be time controlled to reach at least upper surface 220 of first semimetal layer 130. Dry etching, e.g., plasma etching or reactive-ion etching, and/or wet etching etchants or other suitable techniques may be used. After the etching, the patterned mask layer is removed, e.g., by stripping or other suitable technique. For example, the mask layer may be stripped by a solution containing $H_2SO_4$, $H_2O_2$, and/or $NH_4OH$ or other suitable stripping material or solvent.

In some examples, the etching may be performed with multiple stages and using multiple different etching techniques, e.g., a combination of anisotropic plasma etching and isotropic plasma etching. For example, high-K dielectric layer 140 may be first patterned using a mask layer and a first stage etching, which does not reach surface 220 of first semimetal layer 130. Then a second stage etching may be performed to form raised dielectric regions 210 and remove other portions of high-K dielectric layer 140 at least down to upper surface 220 of first semimetal layer 130.

Figure 2A:
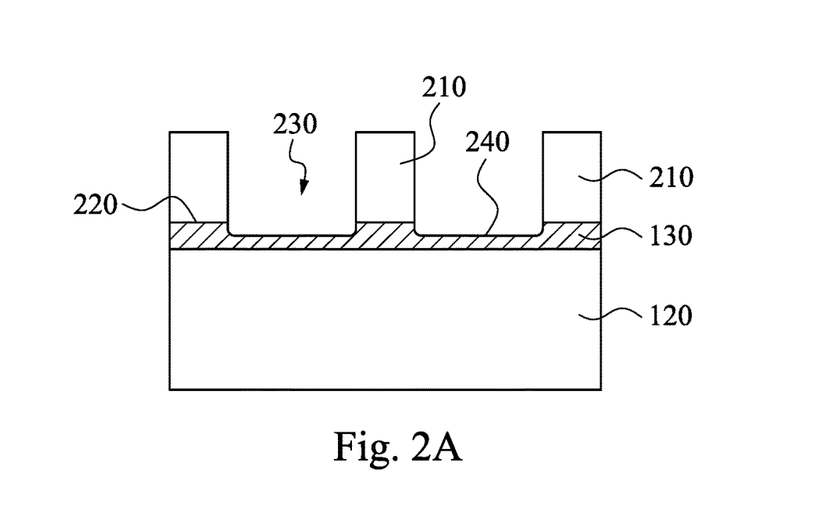

In another example, the etching is controlled to also remove at least portions of first semimetal layer 130 to form recess regions 230 between raised dielectric regions 210. That is, surface 240 of recess regions 230 is below upper surface 220 of first semimetal layer 130, as shown in FIG. 2A. Note that in FIG. 2A, interfacial layer 150 is omitted for simplicity purposes.

Figure 3:
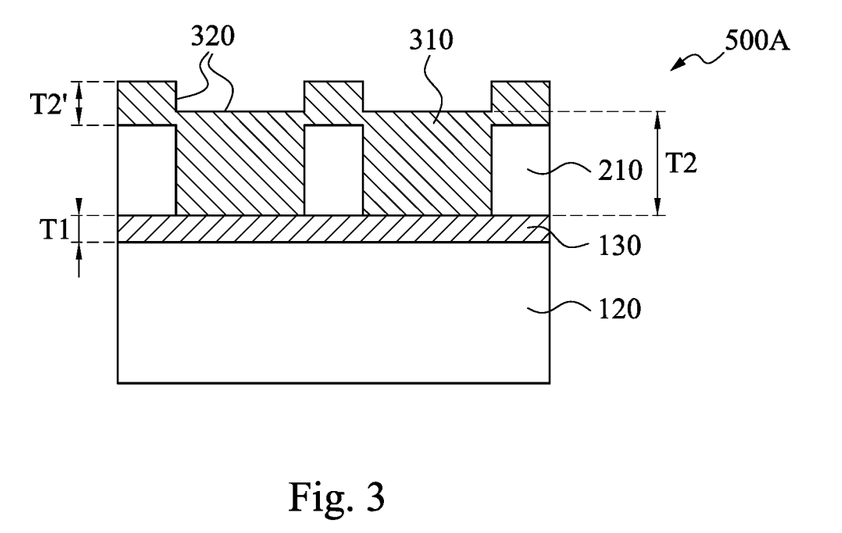

In example operation 950, with reference also to FIG. 3, a second semimetal layer 310 of a second thickness $T_2$ is formed over first semimetal layer 130. In an example, as shown in FIG. 3, second semimetal layer 310 is also formed over raised dielectric regions 210 with a second thickness $T_2'$. As appreciated, thickness $T_2$ may or may not be exactly equal to $T_2'$. Depending on the deposition processes of second semimetal layer 310 and/or the pitch distance between adjacent raised dielectric regions 210, upper surface 320 of second semimetal layer 310 may or may not be level. Further, depending on design requirements, a chemical mechanical planarization (CMP) routine may be performed to level upper surface 320 of second semimetal layer 310.

FIG. 3 shows second semimetal layer 310 with a different cross-hatching pattern than first semimetal layer 130, which does not necessarily indicate that second semimetal layer 310 includes different semimetal material than first semimetal layer 130. The different patterns indicate that second semimetal layer 310 is formed in a different layer and may include a different conductive property than first semimetal layer 130, although they two may include the same semimetal material.

Further, in some examples, second semimetal layer 310 is formed over first semimetal layer 130 but not over raised dielectric regions 210. For example, a CMP routine may be performed to level second semimetal layer 310 with raised dielectric regions 210.

Second semimetal layer 310 is formed of a suitable semimetal material including, but not limited to, bismuth (Bi), Gray Tin (α-Sn), graphite, arsenic (As) and antimony (Sb). In an example, second semimetal layer 310 includes a same semimetal material as first semimetal layer 130, e.g., bismuth (Bi). The deposition of second semimetal layer 310 may be achieved using various suitable approaches including, but not limited to, thermal deposition processes like chemical vapor deposition (CVD), atomic layer deposition (ALD) and remote oxygen scavenging, molecular beam deposition, plasma processes like physical vapor deposition (PVD) and ionized PVD, plating, or other suitable process In an example, thickness $T_2$ and $T_2'$ of second semimetal layer 310 is larger than a second threshold such that second semimetal layer 310 exhibits metal properties. For example, in the case of bismuth (Bi), the second thickness $T_2$ and $T_2'$ is larger or equal to 10 nm. In an embodiment, the thickness $T_2$ and $T_2'$ of the second semimetal layer 310 of bismuth is within a range between about 10 nm to about 100 nm. Depending on the semimetal materials used in first semimetal layer 130, the second threshold may be further determined based on the potential environment temperatures, as the electronic state of a semimetal material may vary with the environmental temperature.

As referred to herein, a metal property of a material or a state of a material indicates that for the material or the state of the material, the Fermi level ($E_F$) lies inside at least one of the conduction band or the valence band, namely there is not a bandgap. In an example, second semimetal layer 310 includes a same semimetal material as first semimetal layer 130. In this scenario, the second thickness $T_2$ could be smaller than the second threshold, e.g., 10 nm for Bi, and the combination of the first thickness $T_1$ of first semimetal layer 130 and the second thickness $T_2$ of second semimetal layer 310 is larger than the second threshold, 10 nm for Bi.

Figure 4:
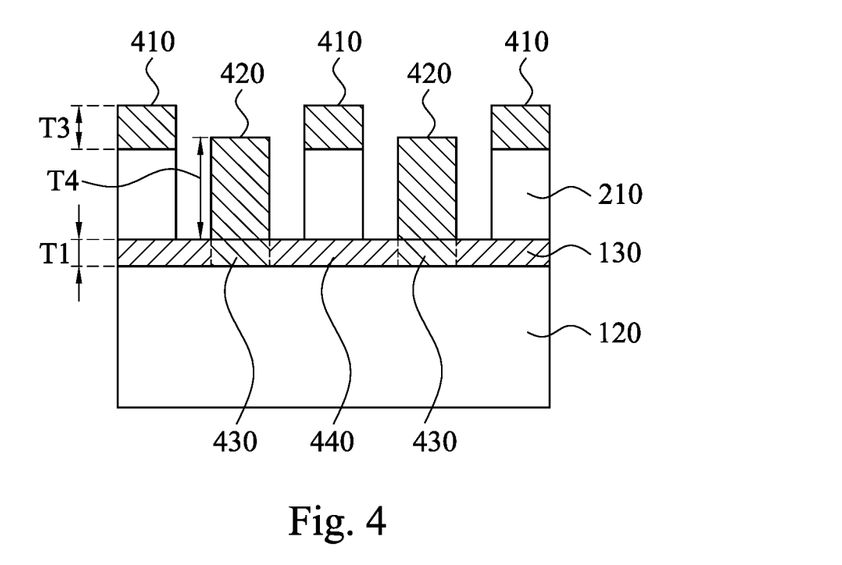

In example operation 960, with reference also to FIG. 4, second semimetal layer 310 is patterned to form a first portion 410 over raised dielectric region 210 and a second portion 420 that at least partially contacts first semimetal layer 130. The patterning of second semimetal layer 310 may use any suitable techniques and all are included in the disclosure. For example, a lithography and etching process may be used to pattern second semimetal layer 310. Various in situ lithography techniques, e.g., electron beam patterning of photoresist and ultraviolet lithography, may be used and multiple stages of various combinations of etching techniques may be used.

First portion 410 has a third thickness $T_3$ and second portion 420 has a fourth thickness $T_4$. Depending on the patterning process, thickness $T_3$ and $T_4$ may or may not equal to second thickness $T_2'$ and $T_2$, respectively. In an example, the third thickness $T_3$ and the fourth thickness $T_4$ are each larger than the second threshold such that first portion 410 and second portion 420 each shows metal properties, e.g., are electrically conductive.

In another example, in the case that second semimetal layer 310 includes the same semimetal material as first semimetal layer 130, a portion 430 (shown with dotted line) of first semimetal layer 130, which is directly below second portion 420, is characterized together with the respective second portion 420 in the electrical property and is treated as a same overall structure as second portion 420. In an example, a combination of the fourth thickness $T_4$ of second portion 420 and the first thickness $T_1$ of portion 430 of first semimetal layer 130 is larger than the second threshold such that second portion 420 and portion 430 together form a structure that exhibits metal properties. In example embodiment, in the case the first and second semimetal layers 130, 310 include bismuth, the combination of the fourth thickness $T_4$ of second portion 420 and the first thickness $T_1$ of portion 430 of first semimetal layer 130 is within a range between about 10 nm to about 100 nm.

First portion 410 is separated from first semimetal layer 130 by intervening raised dielectric region 210. First portion 410 is also separated from second portion 420. FIG. 4 shows as an example that second portion 420 is separated from raised dielectric region 210, which is not limiting. In other examples, as described herein, second portion 420 may contact, and/or partially overlap a raised dielectric region 210.

In an example, first portion 410 with metal properties may be configured as a gate electrode, raised dielectric region 210 of high dielectric constant (K) may be configured as gate dielectric below gate electrode 410, second portions 420 together with or without portion 430 of first semimetal layer 130, which exhibits metal properties, may be configured as source/drain regions, and portion 440 of first semimetal layer 130, which is below gate dielectric 210, may be configured as channel layer 440 of a transistor device.

That is, first semimetal layer 130, as initially formed and or treated with bandgap opening, includes a semiconductor property and functions and/or characterized as a semiconductor body. With the formation of the second portion 420 of second semimetal layer 310 on top of portion 430 of first semimetal layer 130, the electronic property of portion 430 may change. In the case that the first semimetal layer 130 and the second semimetal layer 310, specifically portion 420 and portion 430, are of the same semimetal material, e.g., bismuth, portion 430 merges into portion 420 and together exhibit electronic properties of metal. And thus, only portion 440 servers as a semiconductor body and is configured as a channel layer between two source/drain regions 420. In the case that portions 420 and 430 are of different semimetal materials, portion 430 does not merge into portion 420 and maintains the semiconductor properties. Thus, portion 430, at least partially may be configured, together with portion 440, as a channel layer between two source/drain regions 420. Further, portion 430 may be selectively treated with doping or electrical field to function as buried source/drain region.

In an embodiment, in the case the first semimetal layer 130 and the second semimetal layer 310 are of different semimetal materials, portions 430 of the first semimetal layer 130 may be removed by patterning before the deposition of the second semimetal layer 310 such that portion 420 of the second semimetal 310 extends downward beyond the upper surface 220 of portion 440 of first semimetal layer 130.

Figure 5A:
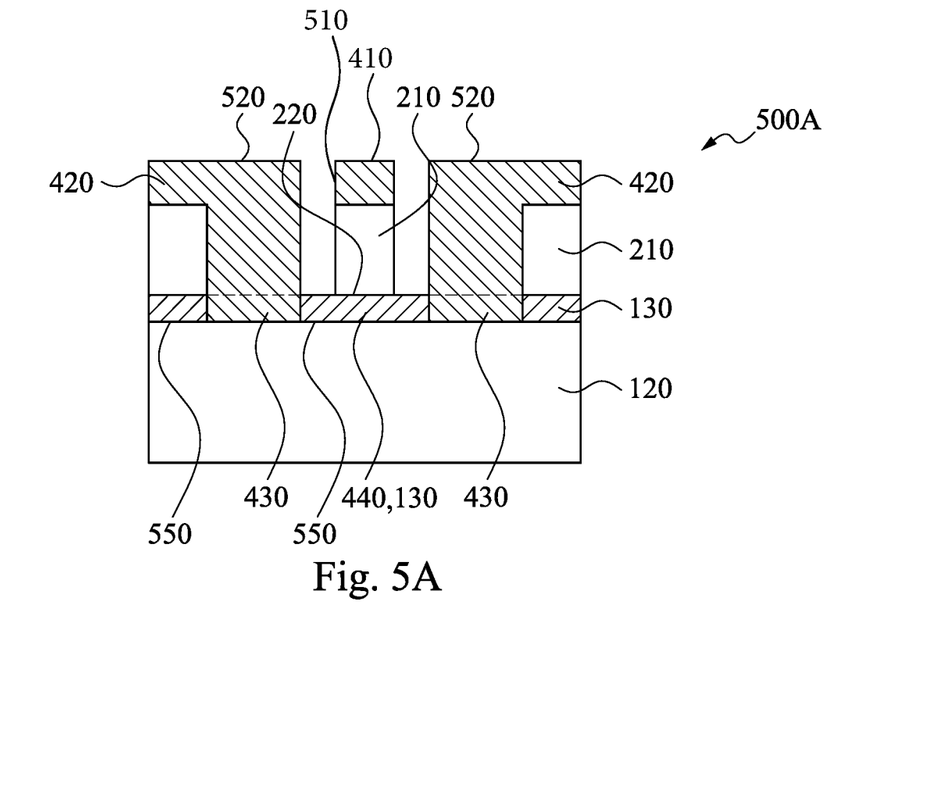
FIGS. 5A-5C illustrate example devices according to embodiments of the disclosure.
Figure 5B:
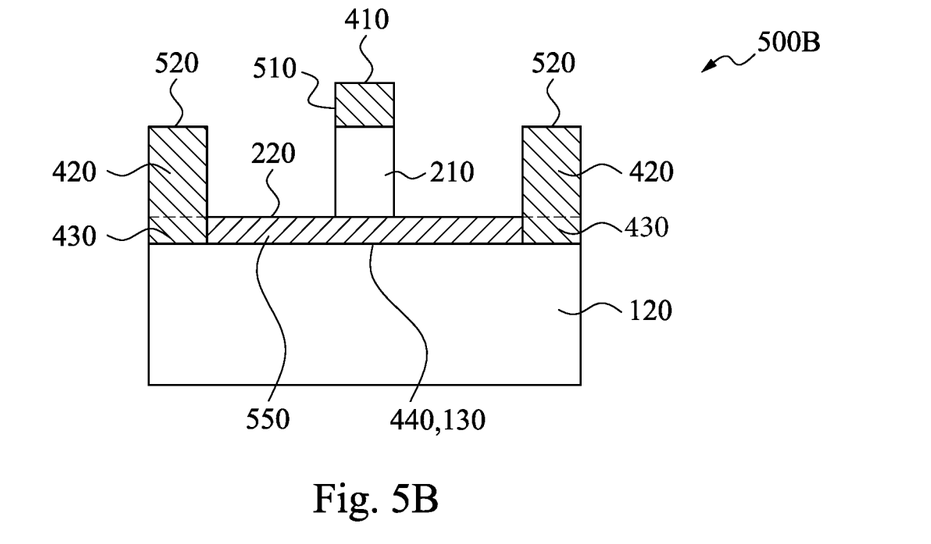
Figure 5C:
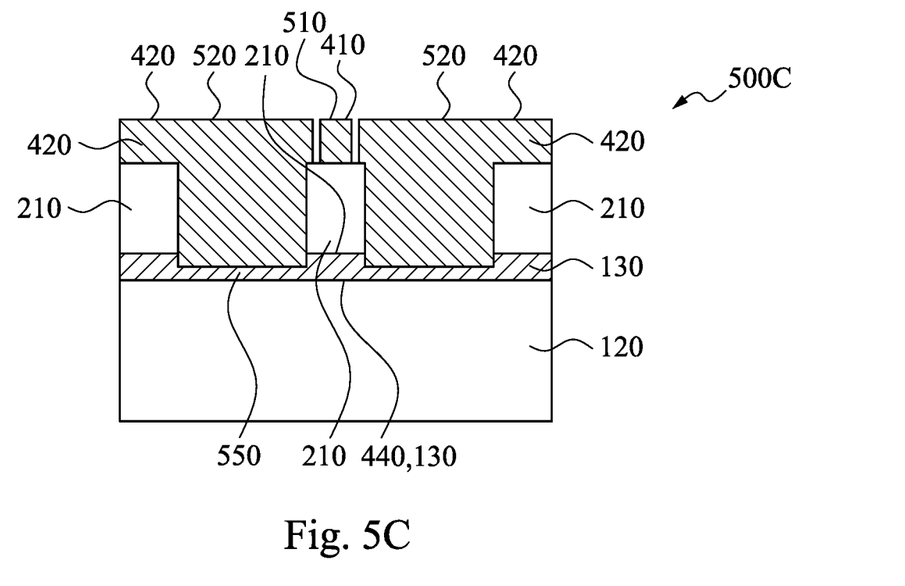

FIGS. 5A-5C illustrate example semiconductor structures each including a transistor device. Referring to 5A-5C together, transistor devices 500 (500A, 500B, 500C) each includes a substrate 120, a channel region 440 of first semimetal layer 130 over substrate 120, a gate structure 510 over first semimetal layer 130, 440, and source/drain structures 520. Gate structure 510 includes a gate electrode 410 of second semimetal layer 310 and high-K gate dielectric layer 210 intervening between gate electrode 410 and first semimetal layer 130, 440. Source/drain structure 520 directly contacts channel region 440, 130. In the example of FIG. 5C, source/drain structure 520 contacts channel regions 440/130 at a spot below upper surface 220 of channel region 440, 130.

In an example, portions of substrate 120 about channel region 440 may be configured to function as a semiconductor channel. As such, transistor 500 may include a channel region partially over substrate 120 and partially within substrate 120.

As shown in FIG. 5A, in an example, top of gate structure 510 is substantially at a same height level as, e.g., coplanar with, top of source/drain structure 520.

As shown in FIG. 5B, in another example, top of gate structure 510 is higher than top of source/drain structure 520.

As shown in FIGS. 5A and 5C, source/drain structure 520 partially overlaps a high-K dielectric layer 210 over first semimetal layer 130. Specifically, in an example, as shown in FIG. 5C, source/drain structure 520 partially overlaps the high-K dielectric layer 210, namely gate dielectric layer 210, of gate structure 520.

In an example, as shown in FIGS. 5A and 5B, gate electrode 410, source/drain structure 520 and channel region 440, 130 include the same semimetal material. In this example, source/drain structure 520 include second portion 420 of second semimetal layer 310 and portion 430 of first semimetal 130, which is below second portion 420. Source/drain structure 520 extends downward to a bottom surface 550 of first semimetal layer 130.

In an example, as shown in FIG. 5C, gate electrode 410 and source/drain structure 520 each includes a second semimetal material of second semimetal layer 310 different than a first semimetal material of the first semimetal layer 130. Source/drain structure 520 extends downward to a surface 560 of first semimetal layer 130 above bottom surface 550

In an example, the height/thickness of gate electrode 410 and source/drain structure 520 are larger than a second threshold, 10 nm for Bi, such that the gate electrode 410 and source/drain structure 520 exhibit metal properties, e.g., are electrically conductive. The thickness of first semimetal layer 130 of the channel region 440 is smaller than a first threshold, 10 nm for Bi, such that the channel region 440 exhibits semiconductor properties.

Figure 6:
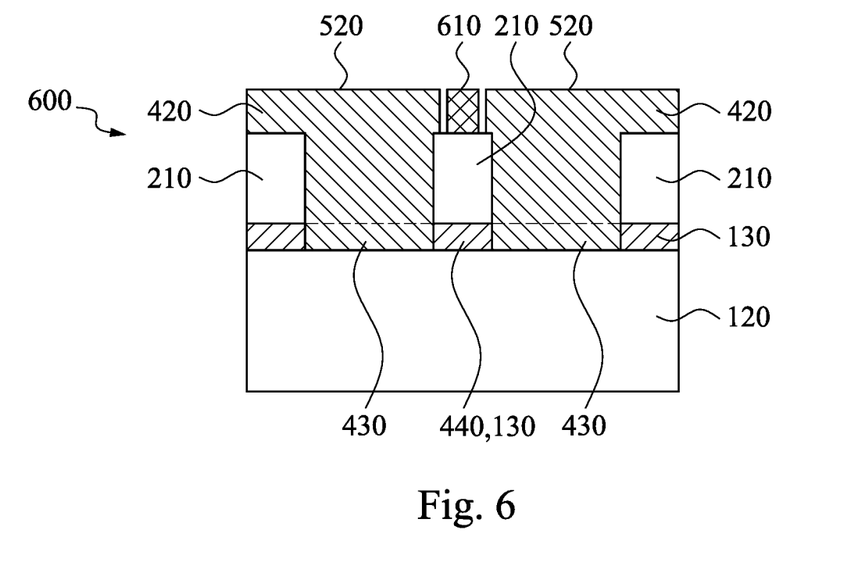
FIG. 6 illustrates another example device according to embodiments of the disclosure.

In another example, as shown in FIG. 6, gate electrode 610 of transistor 600 may be formed using other conductive materials than a semimetal material. For example second semimetal layer 310 is patterned to form source/drain structures 520 and gate electrode 610 may be formed before or after forming source/drain structures 520. For example, gate electrode 610 includes a metal or a metal compound. Suitable metal materials for gate electrode 114 include ruthenium, palladium, platinum, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, gate electrode 114 includes a work function layer tuned to have a proper work function for enhanced performance of the field effect transistor devices. For example, suitable n-type work function metals include Ta, TiAl, TiAlN, TaCN, other n-type work function metal, or a combination thereof, and suitable p-type work function metal materials include TiN, TaN, other p-type work function metal, or combination thereof. In some examples, a conductive layer, such as an aluminum layer, is formed over the work function layer such that the gate electrode 610 includes a work function layer disposed over the gate dielectric 210 and a conductive layer disposed over the work function layer and below a gate cap (not shown for simplicity).

Within substrate 120, there may be various isolation regions (not shown for simplicity) such as shallow trench isolation (STI) regions to isolate one or more devices or logic function areas from one another. The STI regions include silicon oxide, silicon nitride, silicon oxynitride, fluoride-doped silicate glass (FSG), and/or a low-K dielectric material or other suitable materials. In accordance with embodiments described herein, other isolation methods and/or features are possible in lieu of or in addition to the STI.

Further, in some embodiments, a conductive contact electrode, e.g., of a metal material, may be formed over source/drain structure 520.

Figure 7:
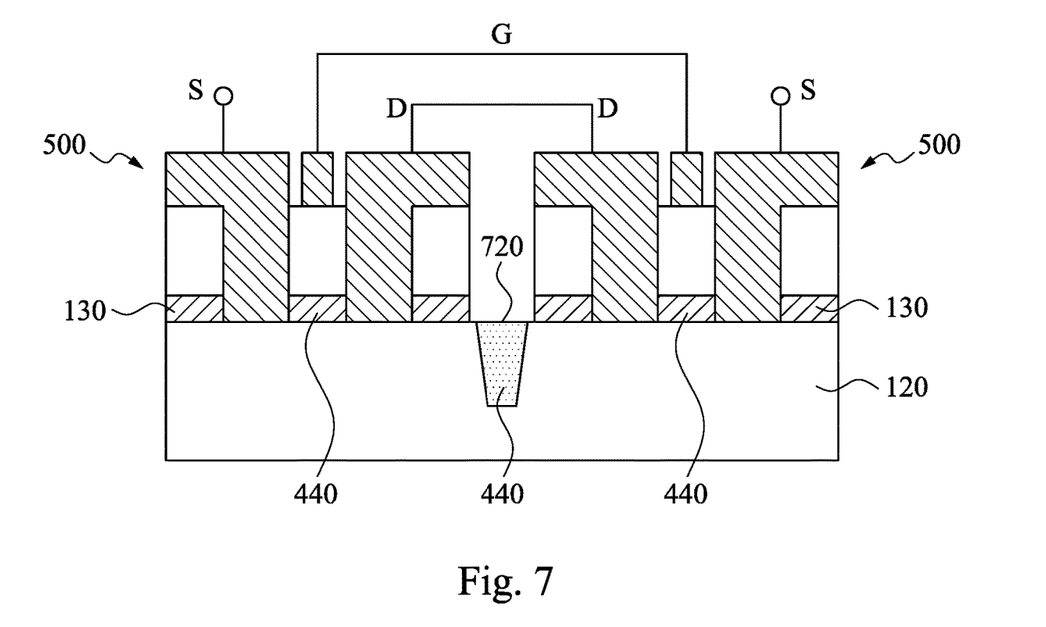
FIG. 7 illustrates an example system of devices according to embodiments of the disclosure.
Figure 8A:
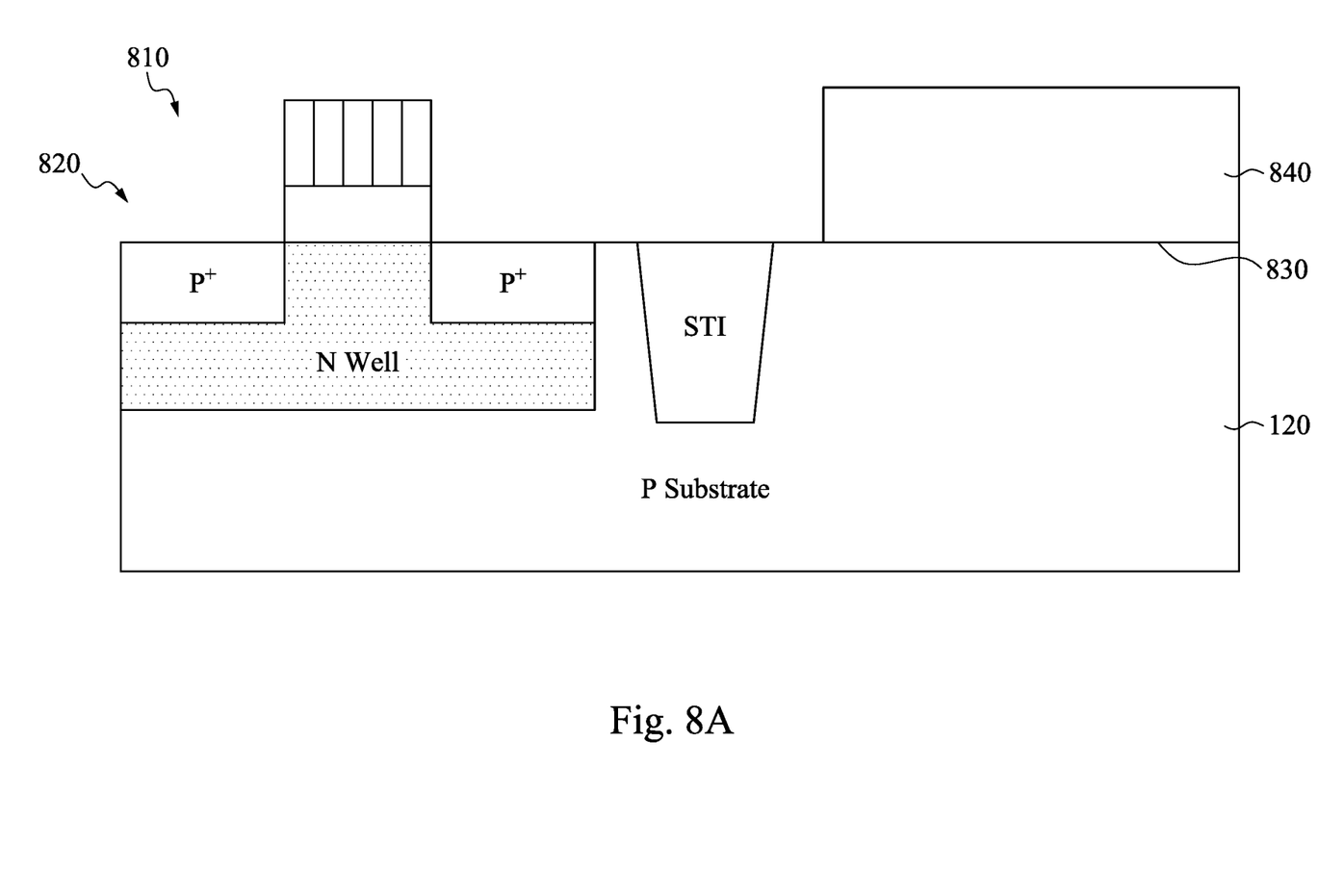
FIGS. 8A and 8B illustrate another example system of devices according to embodiments of the disclosure.
Figure 8B:
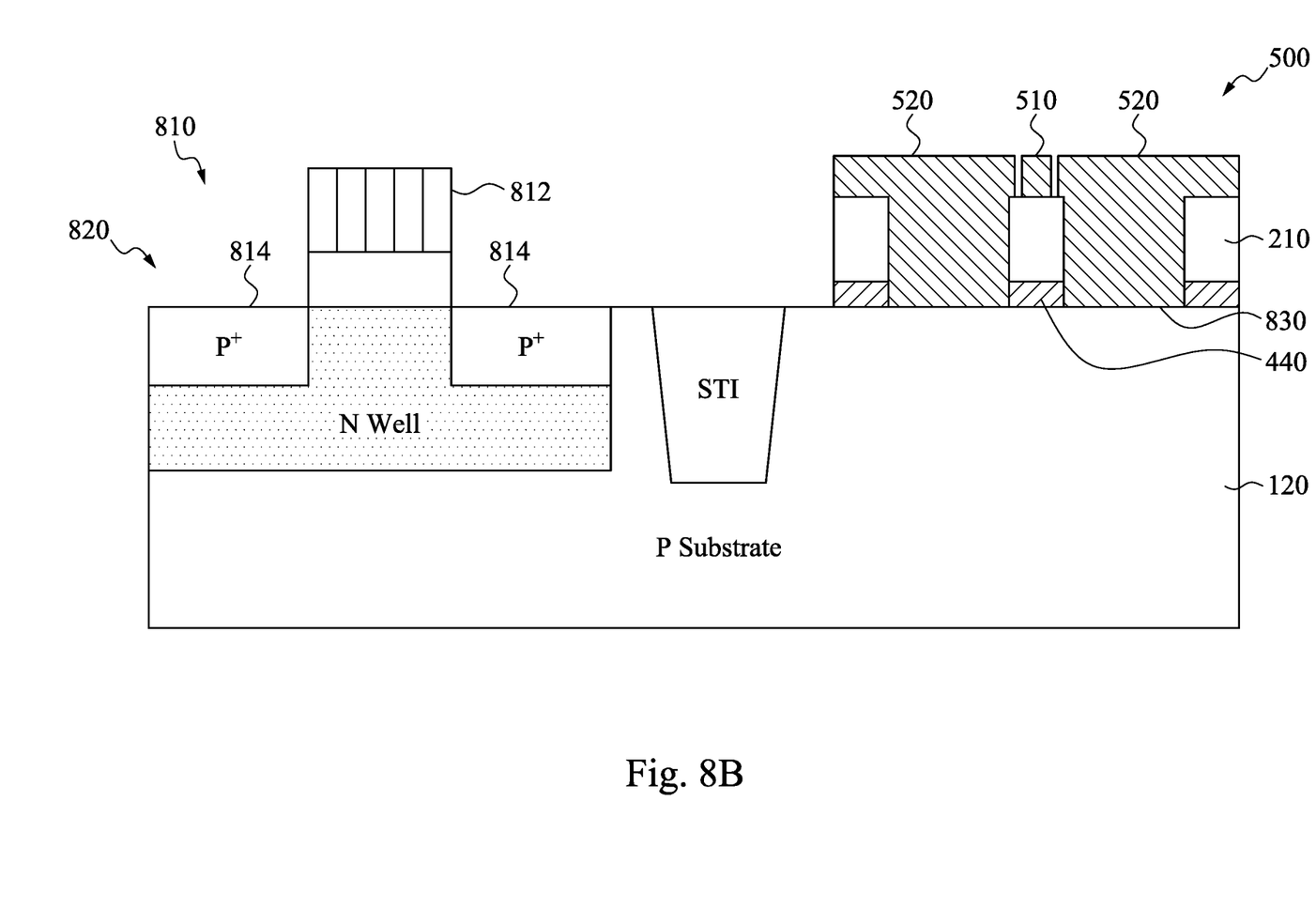

FIG. 7 illustrates a CMOS configuration using the transistors of FIGS. 5A-5C and FIG. 6. As shown in FIG. 7, two devices 500 are coupled as a CMOS and the two devices 500 are isolated by an STI region 710 in substrate 120 and a void region 720 in first semimetal layer 130. The channel regions 440 of the devices 500 may be configured as N-type or P-type based on the voltage level, VDD/VCC applied to the source structure ("S"). Further, the channels 440 of FIG. 7 may also be configured differently as either N-type or P-type using other approaches, e.g., doping, straining and/or patterning. FIG. 7 shows as an illustrative example that the first semimetal layer 130 and the second semimetal layer in the source "S" or drain "D" regions are of the same semimetal material and portions of first semimetal layer 130 that directly contact the source "S" or drain "D" regions become part of the respective source/drain region and have metal properties. Other embodiments of device 500, e.g., those shown in FIGS. 5A-5C and 6, are also possible for the FIG. 7 configuration. In an example, as illustrated in FIGS. 8A and 8B, a different type of transistors 810, shown as a PNP transistor for non-limiting illustrative purposes only, may be formed on a first area 820 of substrate 120, shown as a P type substrate for non-limiting illustrative purposes, while area 830 of substrate 120 is covered by a capping layer 840. As shown in FIGS. 8A and 8B, transistor 810 includes a gate 812 over substrate 120 and source/drain regions 814 at least partially within substrate 120.

In accordance with the example illustrated in FIGS. 8A and 8B, the capping layer 840 is removed and a transistor 500 like the ones shown in FIGS. 5A-5C and FIG. 6 is made using the processes shown in FIGS. 1-4, as an illustrative example.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

A semiconductor structure, e.g., a transistor in accordance with some of the embodiments described herein includes a thin semimetal layer as a channel region over a substrate, e.g., less than 10 nm for bismuth (Bi), which includes bandgap opening and exhibits semiconductor properties. The source/drain region includes a thicker semimetal layer, e.g., more than 10 nm for bismuth (Bi), over the thin semimetal layer, which exhibits metal properties. The source/drain region includes a same or similar semimetal material as the channel region such that the contact resistance issues parasitic to the metal semiconductor junction of transistors are effectively improved. The example fabrication processes are also relatively simple and cost effective.

The present disclosure may be further appreciated with the description of the following embodiments:

In a method embodiment, a first semimetal layer of a first thickness is formed on a substrate. A dielectric layer of high dielectric constant is formed over the first semimetal layer. The dielectric layer is patterned to form a dielectric region. A second semimetal layer of a second thickness is formed over the first semimetal layer and the dielectric region. The second semimetal layer is patterned to form a first portion and a separated second portion, while the first portion is over the dielectric region and separated from the first semimetal layer by the dielectric region.

In another method embodiment, a first semimetal layer of a first thickness is formed on a substrate. A dielectric layer of high dielectric constant is formed over the first semimetal layer. The dielectric layer is patterned to form a dielectric region. A second semimetal layer of a second thickness is formed over the first semimetal layer. A source/drain structure is formed adjacent to the dielectric region by patterning the second semimetal layer.

A device embodiment includes a substrate, a channel region of a first semimetal layer over the substrate, a gate structure over the first semimetal layer, the gate structure including a gate electrode of a second semimetal layer and a high-K dielectric layer between the first semimetal layer and the second semimetal layer, and a source/drain structure over the substrate, which includes a semimetal material.

In further device embodiments, a semiconductor structure includes a substrate, a channel region at least partially over the substrate, the channel region including a semimetal layer that includes a semiconductor bandgap, and a source/drain structure over the substrate and adjacent to the channel region, the source/drain structure having a metal property and including a semimetal that is the same as a semimetal of the semimetal layer.

The invention claimed is:

1. A semiconductor structure, comprising:
   a substrate;
   a first semimetal layer of a semimetal material and including a channel region of a first transistor at least partially over the substrate, the first semimetal layer having a semiconductor property;
   a second semimetal layer on the first semimetal layer and of a same semimetal material as the first semimetal layer and having a metal property, the second semimetal layer including:
   a source structure of the first transistor extending higher than the channel region;
   a drain structure of the first transistor extending higher than the channel region; and
   a gate electrode above the first semimetal layer, wherein the source structure, the drain structure, and the gate electrode are of the semimetal material, wherein a top surface of the source structure, a top surface of the drain structure, and a top surface of the gate electrode are of a same height and correspond to a top surface of the second semimetal layer.

2. The semiconductor structure of claim 1, wherein the first transistor includes a gate dielectric including a high-K dielectric layer between the first semimetal layer and the gate electrode.

3. The semiconductor structure of claim 2, wherein the source structure partially overlaps the high-K dielectric layer.

4. The semiconductor structure of claim 2, further including a second transistor, the second transistor including a gate structure over the substrate and a source region at least partially within the substrate.

5. The semiconductor structure of claim 1, wherein the source structure and the drain structure directly contact the channel region.

6. The semiconductor structure of claim 5, wherein the source structure directly contacts the channel region below an upper surface of the channel region.

7. The semiconductor structure of claim 1, further comprising a high-K dielectric layer over the first semimetal layer, and wherein the source structure partially overlaps the high-K dielectric layer.

8. The semiconductor structure of claim 1, wherein the semimetal material is one or more of bismuth, arsenene, arsenic, antimonene, antimony, α-tin, phosphorene, graphene, graphite, stanine, or germanene.

9. The semiconductor structure of claim 1, wherein the source structure extends downward to a bottom surface of the first semimetal layer.

10. The semiconductor structure of claim 9, wherein the first semimetal layer is thinner than the second semimetal layer.

11. The semiconductor structure of claim 1, wherein the first semimetal layer and the second semimetal layer are bismuth.

12. A structure, comprising:
   a substrate
   a first layer of bismuth of a first thickness on the substrate and including a first portion corresponding to a channel region of a transistor;
   a dielectric layer over a first portion of the first layer of bismuth, the first portion of the first layer of bismuth including a semiconductor property;
   a second layer of bismuth of a second thickness directly over a second portion of the first layer of bismuth laterally outside the first portion, a combination of the first thickness and the second thickness being in a range between about 10 nm to about 100 nm such that the second layer of bismuth includes a metal property, the second layer of bismuth including a source structure of the transistor and a drain structure of the transistor; and
   a third layer of bismuth over the dielectric layer and including a gate electrode of the transistor, wherein a top surface of the source structure, a top surface of the drain structure, and a top surface of the gate electrode are of a same height.

13. The structure of claim 12, wherein the first thickness is in a range between about 1.5 nm to about 9.5 nm.

14. The structure of claim 12, wherein the second layer of bismuth overlaps the dielectric layer.

15. A device, comprising:
   a substrate;
   a semiconductor region at least partially over the substrate, the semiconductor region including a first semimetal layer of a first semimetal material, the first semimetal layer having a semiconductor property and being structured as a channel region;
   a second semimetal layer of the first semimetal material on the first semimetal layer and including:
   a source structure adjacent to and higher than the semiconductor region; and
   a drain structure adjacent to and higher than the semiconductor region, the second semimetal layer having a metal property; and a gate dielectric including a high-K dielectric material over the first semimetal layer; and a gate electrode of the first semimetal material over the gate dielectric, wherein a top surface of the source structure, a top surface of the drain structure, and a top surface of the gate electrode are of a same height and correspond to a top surface of the second semimetal layer.

16. The device of claim 15, wherein the first semimetal material is one or more of bismuth, arsenene, arsenic, antimonene, antimony, α-tin, phosphorene, graphene, graphite, stanine, or germanene.

17. The device of claim 15, wherein a portion of the source structure is on a top surface of the gate dielectric.

18. The semiconductor structure of claim 15, wherein the source structure extends downward to a bottom surface of the first semimetal layer.

19. The semiconductor structure of claim 15, wherein the first semimetal layer is thinner than the second semimetal layer.

20. The semiconductor structure of claim 15, wherein the first semimetal layer and the second semimetal layer are bismuth.

* * * * *